United States Patent
Chuang et al.

(10) Patent No.: US 8,705,228 B2
(45) Date of Patent: Apr. 22, 2014

(54) PIVOTING APPARATUS

(75) Inventors: Chih-Kuo Chuang, Hsin-Chu (TW); Li-Wen Chang, Hsin-Chu (TW)

(73) Assignee: Young Lighting Technology Inc., Hsin-Chu (TW)

( * ) Notice: Subject to any disclaimer, the term of this patent is extended or adjusted under 35 U.S.C. 154(b) by 192 days.

(21) Appl. No.: 13/450,442

(22) Filed: Apr. 18, 2012

(65) Prior Publication Data

US 2013/0050917 A1 Feb. 28, 2013

(30) Foreign Application Priority Data

Aug. 29, 2011 (CN) .......................... 2011 1 0261790

(51) Int. Cl.
*H05K 5/00* (2006.01)
*H05K 7/00* (2006.01)
*G06F 3/02* (2006.01)
*H01J 1/62* (2006.01)

(52) U.S. Cl.
USPC ............ 361/679.21; 361/679.23; 361/679.57; 361/679.58; 361/732; 248/919; 248/920; 248/921; 248/923; 313/504; 345/169

(58) Field of Classification Search
USPC ............... 361/679.01–679.3, 679.55–679.58, 361/679.4–679.45, 730–732; 345/168, 169, 345/156, 157, 905; 248/917–924; 349/58, 349/64, 141, 122

See application file for complete search history.

(56) References Cited

U.S. PATENT DOCUMENTS

| 5,377,076 A * | 12/1994 | Wen .......................... 361/679.01 |
| 2007/0277993 A1* | 12/2007 | Chen ................................ 174/66 |
| 2010/0188178 A1* | 7/2010 | Chen .............................. 335/205 |

FOREIGN PATENT DOCUMENTS

| CN | 201188662 Y | 1/2009 |
| CN | 201608805 U | 10/2010 |
| TW | M388025 | 9/2010 |
| TW | M407474 | 7/2011 |

\* cited by examiner

*Primary Examiner* — Jenny L Wagner
*Assistant Examiner* — Jerry Wu
(74) *Attorney, Agent, or Firm* — Jianq Chyun IP Office

(57) ABSTRACT

A pivoting apparatus includes first and second pivoting elements, and first and second waterproof structures. The first pivoting element is fixed to a base, and has a first internal space and an opening exposing the first internal space. The second pivoting element is pivoted on the first pivoting element and fixed to an electronic device. A second internal space and a gap exposing the second internal space are formed between the first and second pivoting elements. The second internal space communicates with the first internal space through the opening. The first waterproof structure is fixed to the first pivoting element and surrounds at least a portion of the opening to block liquid from entering the first internal space through the opening. The second waterproof structure is fixed to the second pivoting element and shields the gap to block liquid from entering the second internal space through the gap.

13 Claims, 6 Drawing Sheets

PIVOTING APPARATUS

CROSS-REFERENCE TO RELATED APPLICATION

This application claims the priority benefit of China application serial no. 201110261790.5, filed on Aug. 29, 2011. The entirety of the above-mentioned patent application is hereby incorporated by reference herein and made a part of this specification.

BACKGROUND OF THE INVENTION

1. Field of the Invention

The present invention relates to a pivoting apparatus, and more particularly, to a pivoting apparatus for use with an electronic device.

2. Description of Related Art

With continuous advancement of information technology, various electronic products, such as, personal digital assistants (PDAs), tablet PCs, digital still cameras, global positioning system (GPS) devices and displays for electronic devices, have been developed. These electronic devices can be connected with a pivoting apparatus depending upon requirements in use. For example, GPS devices or PDAs can be mounted in a car using a pivoting apparatus to facilitate user's view and operation. Besides, digital still cameras, tablet PCs, displays, or the like, can be mounted to a pivoting apparatus to facilitate their use.

For example, a display mounted to a pivoting apparatus can pivot by the pivoting apparatus to adjust to an angle suitable for a user to view a displayed image, or adjust the angle to allow users at different positions to view the displayed image. However, pivoting apparatuses are generally assembled by multiple parts. Outside liquid tends to enter the pivoting apparatus through a gap or opening among these parts. As a result, the overall structure has a poor waterproof capability.

Chinese Patent Issue Number CN201188662 discloses a TV bracket which is waterproofed using a sealing tap. Taiwan Patent Number TWM388025 discloses a waterproof and shock-resistant apparatus for a tablet PC, which utilizes an elastic material to achieve the waterproof and shock-resistant results. Chinese Patent Issue Number CN201608805U discloses a waterproof base for an enclosure. The waterproof base and the enclosure are sealed and connected to achieve the waterproof result. Taiwan Patent Number TWM407474 discloses a waterproof keypad structure that has the waterproof function when the keypad structure stops operation as well as when the keypad structure is operating by means of the elastic deformation characteristic thereof.

SUMMARY OF THE INVENTION

Accordingly, the present invention is directed to a pivoting apparatus which has a good waterproof effect.

The present invention provides a pivoting apparatus including a first pivoting element, a second pivoting element, a first waterproof structure, and a second waterproof structure. The first pivoting element is fixed to a base and the first pivoting element has a first internal space and an opening. The opening exposes the first internal space. The second pivoting element is pivoted on the first pivoting element and the second pivoting element is fixed to an electronic device. A second internal space and a gap are formed between the first pivoting element and the second pivoting element. The gap exposes the second internal space. The second internal space is in communication with the first internal space through the opening. The first waterproof structure is fixed to the first pivoting element and the first waterproof structure surrounds at least a portion of the opening to block liquid from entering the first internal space through the opening The second waterproof structure is fixed to the second pivoting element and the second waterproof structure shields the gap to block liquid from entering the second internal space through the gap.

In view of the foregoing, the above embodiment of the present invention has at least one of the following advantages. The first waterproof structure fixed to the first pivoting element surrounds at least a portion of the opening to reduce the possibility of liquid entering the first internal space through the opening, and the second waterproof structure fixed to the second pivoting element shields the gap to reduce the possibility of liquid entering the second internal space through the gap. When the pivoting apparatus is splashed with outside liquid, the pivoting apparatus can be effectively waterproofed sequentially using the blockage of the second waterproof structure and the first waterproof structure to prevent internal components in the pivoting apparatus, the electronic device and the base from contacting the liquid to influence the normal operation thereof.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
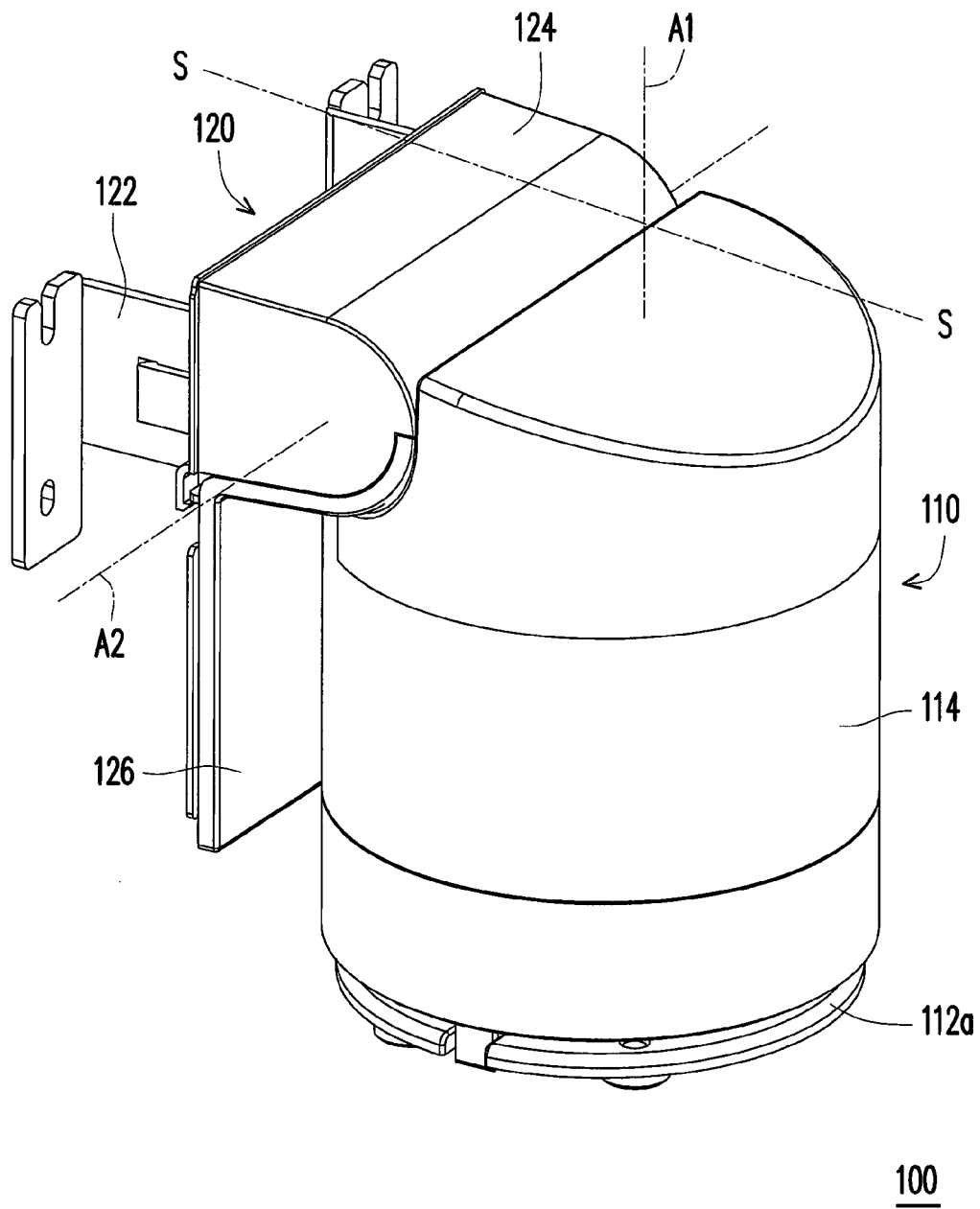
FIG. 1 is a perspective view of a pivoting apparatus according to one embodiment of the present invention.
Figure 2:
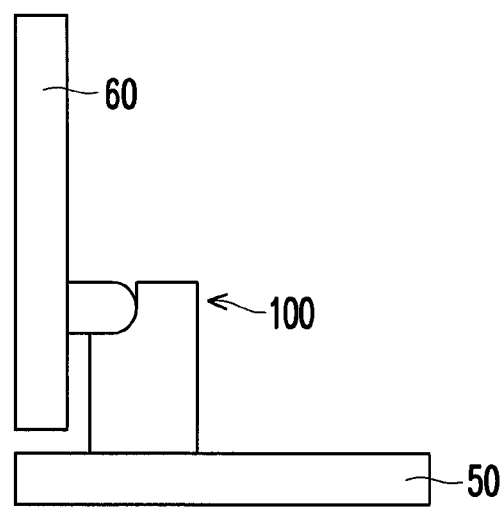
FIG. 2 is a side view of the pivoting apparatus of FIG. 1 which is applied to an electronic device.
Figure 3:
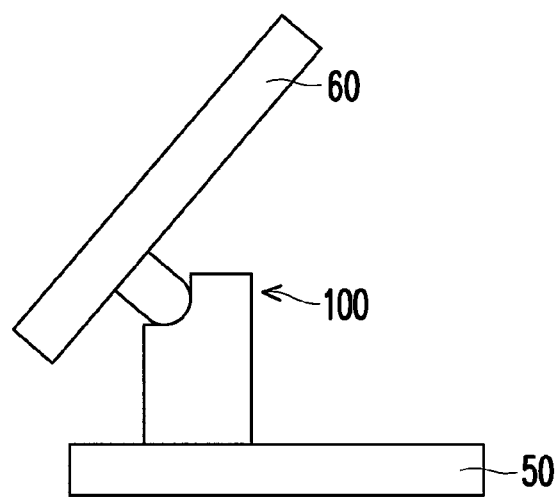
FIG. 3 is an operational view of the pivoting apparatus of FIG. 2.

FIG. 1 is a perspective view of a pivoting apparatus according to one embodiment of the present invention. FIG. 2 is a side view of the pivoting apparatus of FIG. 1 which is applied to an electronic device. FIG. 3 is an operational view of the pivoting apparatus of FIG. 2. Referring to FIG. 1 to FIG. 3, the pivoting apparatus 100 of the present embodiment includes a first pivoting element 110 and a second pivoting element 120. The first pivoting element 110 is fixed to a base 50, and the second pivoting element 120 is pivoted on the first pivoting element 110 and the second pivoting element 120 is fixed to an electronic device 60. The first pivoting element 110 and the second pivoting element 120 are adapted to pivot relative to each other to drive the electronic device 60 to tilt from the state of FIG. 2 to the state of FIG. 3 or another angle, thereby facilitating users viewing information shown on the electronic device 60.

Figure 4:
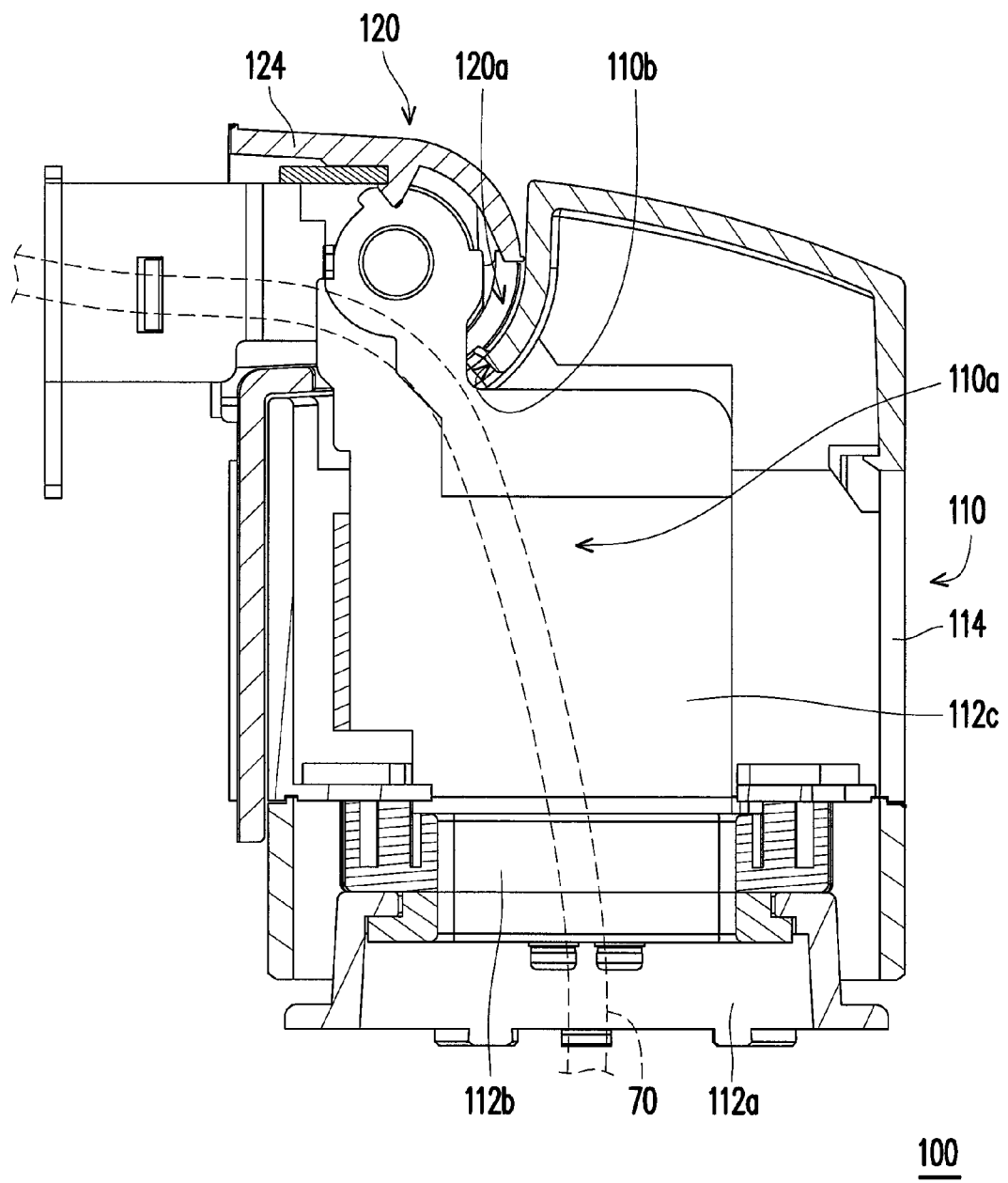
FIG. 4 is a cross sectional view along the section line SS of the pivoting apparatus of FIG. 1.
Figure 5:
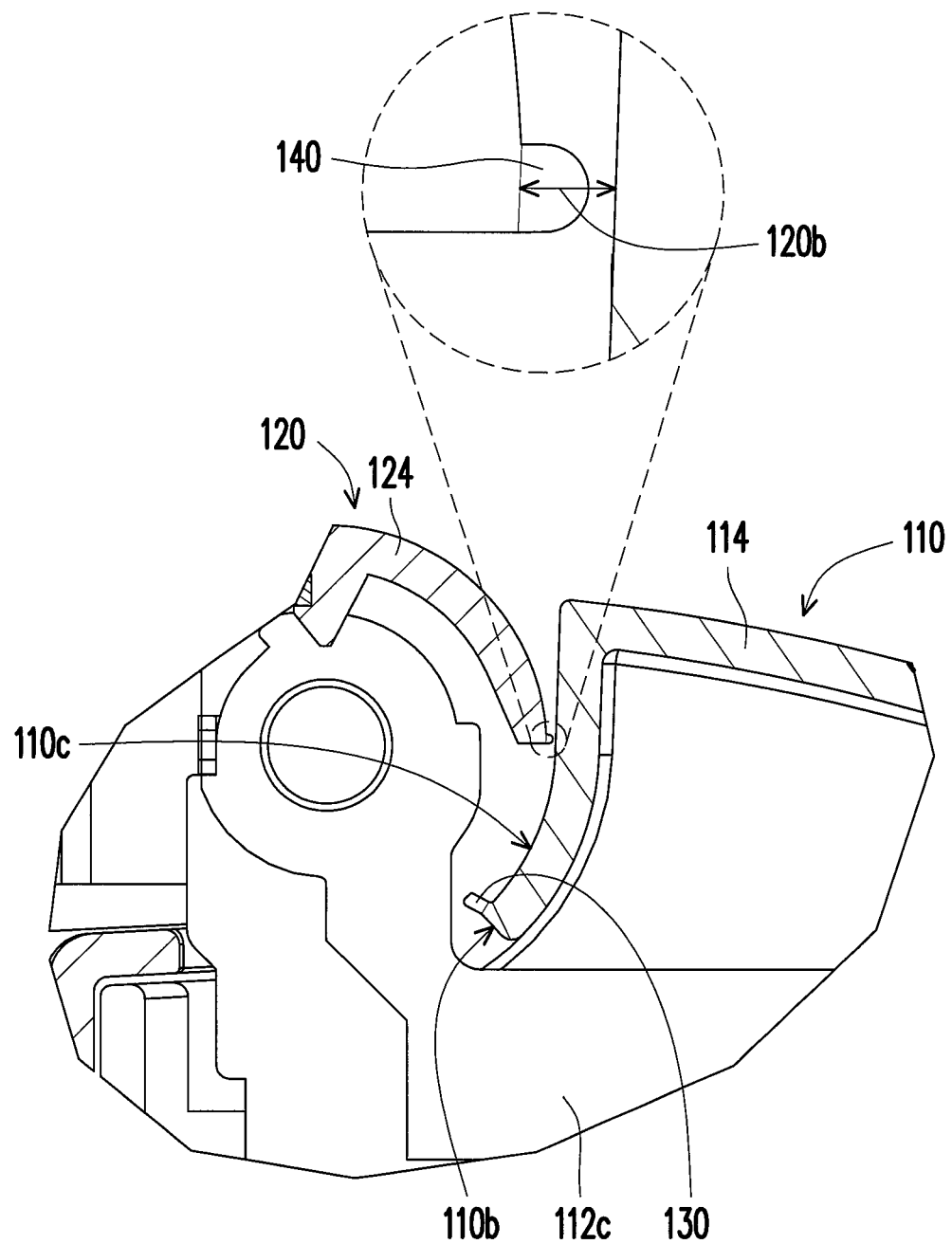
FIG. 5 is an enlarged view of partial of the pivoting apparatus of FIG. 4.
Figure 6:
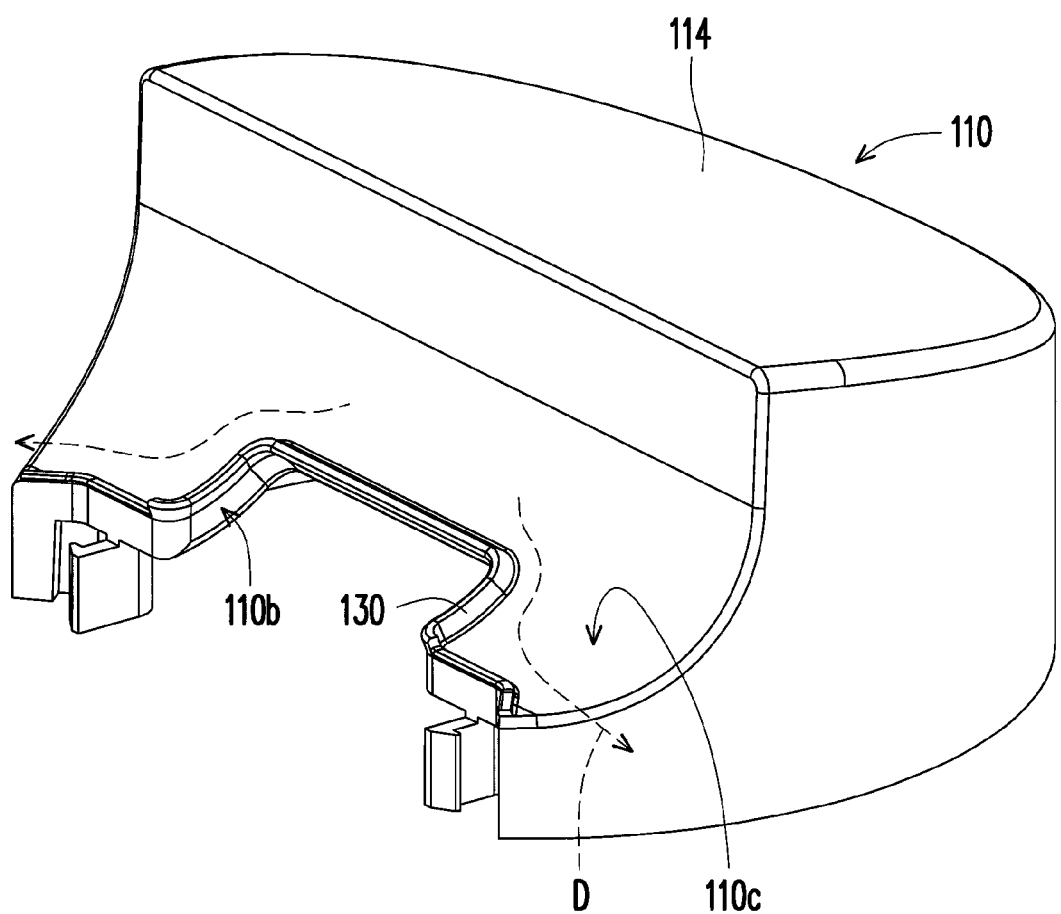
FIG. 6 is a perspective view of parts the first pivoting element of FIG. 1.

FIG. 4 is a cross sectional view along the SS line of the pivoting apparatus of FIG. 1. FIG. 5 is an enlarged view of partial of the pivoting apparatus of FIG. 4. FIG. 6 is a perspective view of parts of the first pivoting element of FIG. 1. Referring to FIG. 4 to FIG. 6, the first pivoting element 110 of the present embodiment includes a first internal space 110a and an opening 110b. The first internal space 110a is exposed through the opening 110b. A second internal space 120a and a gap 120b are formed between the first pivoting element 110 and the second pivoting element 120. The second internal space 120a is exposed through the gap 120b. The second internal space 120a is in communication with the first internal space 110a through the opening 110b. The pivoting apparatus 100 includes a first waterproof structure 130 and a second waterproof structure 140. The first waterproof structure 130 is fixed to the first pivoting element 110 and the first waterproof structure 130 surrounds at least a portion of the opening 110b to block liquid from entering the first internal space 110a through the opening 110b. The second waterproof structure 140 is fixed to the second pivoting apparatus 120 to shield the gap 120b to block liquid from entering the second internal space 120a through the gap 120b.

In the construction described above, the first waterproof structure 130 fixed to the first pivoting element 110 surrounds at least a portion of the opening 110b to reduce the possibility of liquid entering the first internal space 110a through the opening 110b, and the second waterproof structure 140 fixed to the second pivoting element 120 shields the gap 120b to reduce the possibility of liquid entering the second internal space 120a through the gap 120b. When the pivoting apparatus 100 is splashed with outside liquid, a primary waterproofing can be achieved by the second waterproof structure 140. If part of the liquid accidentally enters the second internal space 120a, a secondary waterproofing can be achieved by the first waterproof structure 130. That is, the pivoting apparatus 100 can be effectively waterproofed sequentially using the blockage of the second waterproof structure 140 and the first waterproof structure 130 to prevent internal components in the pivoting apparatus 100, the electronic device 60 and the base 50 from contacting the liquid to influence the normal operation thereof.

In the present embodiment, the electronic device 60 is, but not limited to, for example, a display. In various other embodiments, the electronic device 60 may be another suitable type of electronic device. In addition, in the present embodiment, the first pivoting element 110 and the first waterproof structure 130 are made from, for example, plastic and are integrally formed, the second pivoting element 120 and the second waterproof structure 140 are made from, for example, plastic and are integrally formed. However, the present invention is not limited to the plastic material and integral construction. In other embodiments, the first pivoting element 110, the second pivoting element 120, the first waterproof structure 130 and the second waterproof structure 140 may be made from other suitable materials. For example, the material of the second waterproof structure 140 may be rubber so as to surely seal the gap 120b by means of its elastic deformation characteristic. The second pivoting element 120 made from plastic and the second waterproof structure 140 made from rubber may be integrally formed using a double injection molding process.

Referring to FIG. 5 and FIG. 6, in the present embodiment, the first waterproof structure 130 and the second waterproof structure 140 are each a rib. The first pivoting element 110 has a curved surface 110c. The gap 120b is formed between the curved surface 110c and the second pivoting element 120. The second waterproof structure 140 is adapted to slide over the curved surface 110c with the relative pivoting movement between the first pivoting element 110 and the second pivoting element 120, such that the gap 120b between the first pivoting element 110 and the second pivoting element 120 is maintained shielded by the second waterproof structure 140, i.e. the second waterproof structure 140 and the curved surface 110c closely touch each another so that the pivoting apparatus 100 is in a waterproofing state at any time.

In the present embodiment, the curved surface 110c of the first pivoting element 110 and the first waterproof structure 130 can guide liquid away from the first opening 110b. The curved surface 110c of the first pivoting element 110 may allow the liquid to flow downward along the smooth curved surface 110c. However, the first waterproof structure 130 is a rib higher than the curved surface 110c. As a result, when the liquid flows to the first waterproof structure 130, it flows downward along the rib structure and will not flow to the opening 110b. Therefore, even if part of the outside liquid accidentally enters the second internal space 120a, the liquid will not flow to the opening 110b. Instead, the entered liquid is guided by the curved surface 110c and the first waterproof structure 130 to another place along a direction D shown in FIG. 6.

In the present embodiment, the base 50 and electronic device 60 shown in FIG. 2 and FIG. 3 are electrically connected through a conducting wire 70. The conducting wire 70 is disposed in the pivoting apparatus 100 and passes the opening 110b to connect the base 50 to the electronic device 60. With the pivoting apparatus 100 shielding the conducting wire 70 (i.e. the conducting wire 70 is hidden within the pivoting apparatus 100), the overall structure can have an improved appearance and the conducting wire 70 can be prevented from being damaged due to exposure to the outside.

Figure 7:
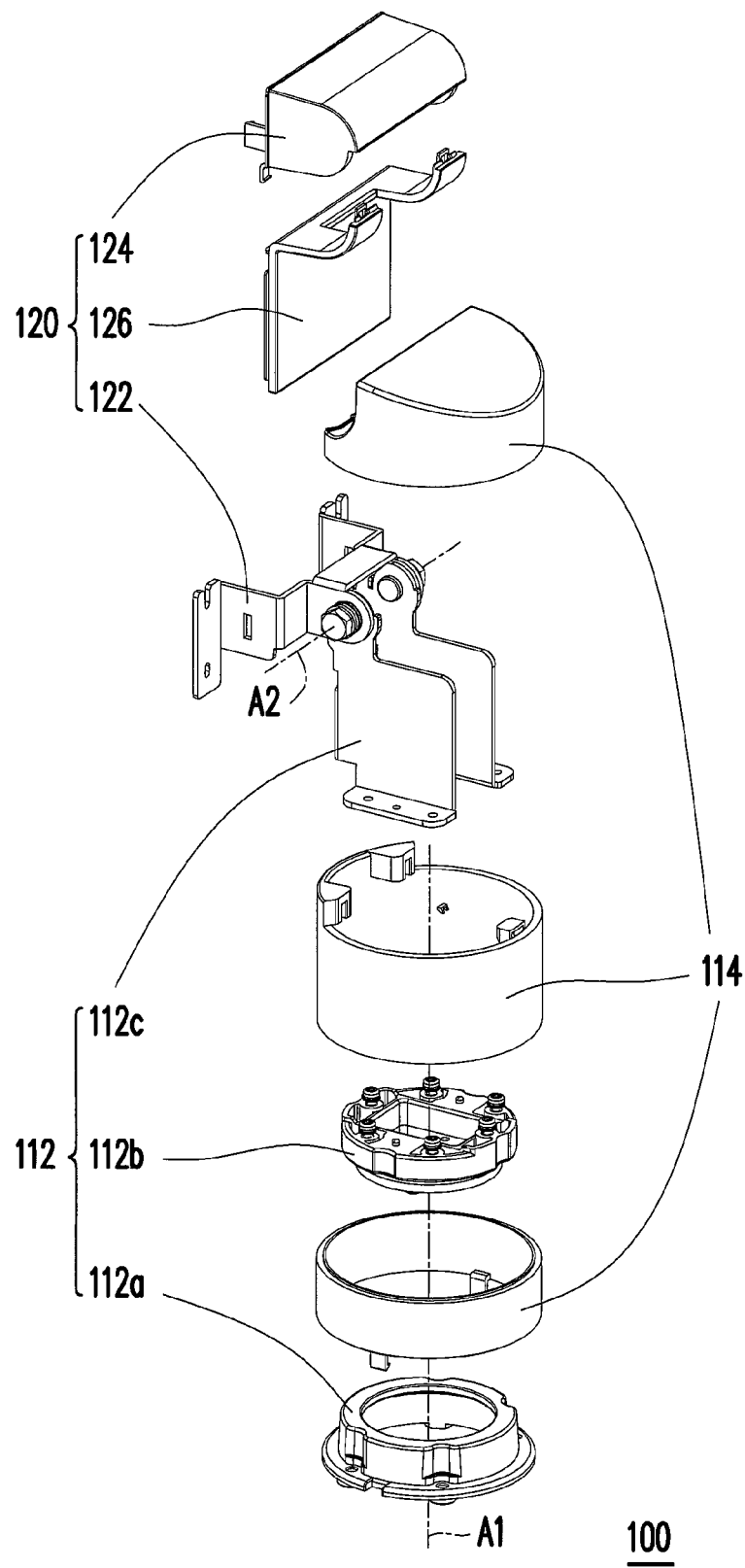
FIG. 7 is an exploded view of the pivoting apparatus of FIG. 1.

FIG. 7 is an exploded view of the pivoting apparatus of FIG. 1. Referring to FIG. 1, FIG. 5 and FIG. 7, in the present embodiment, the first pivoting element 110 includes a main body 112 and an housing 114. The main body 112 is pivoted by the second pivoting element 120 and the main body 112 is fixed to the base 50 shown in FIG. 2 and FIG. 3. The housing 114 defines the first internal space 110a and the opening 110b as described above. The main body 112 is disposed in the first internal space 110a. The second pivoting element 120 includes a pivot portion 122 and an housing 124. The pivot portion 122 is pivoted on the first pivoting element 110 and the pivot portion 122 is fixed to the electronic device 60 shown in FIG. 2 and FIG. 3. The second internal space 120a and the gap 120b are formed between the housing 124 and the first pivoting element 110. At least a part of the pivot portion 122 is disposed in the second internal space 120a.

Specifically, the main body 112 includes a fixing portion 112a, a rotary plate 112b and a pivot portion 112c. The fixing portion 112a is fixed to the base 50 shown in FIG. 2 and FIG. 3. The rotary plate 112b is pivoted on the fixing portion 112a about an axis A1. The pivot portion 112c is fixed to the rotary plate 112b and pivoted on the second pivoting element 120 about an axis A2. The axis A2 is perpendicular to the axis A1. As such, the electronic device 60 can not only adjust its inclining angle through the relative pivoting movement between the first pivoting element 110 and the second pivoting element 120 about the axis A2, but it also can adjust its orientation via the relative pivoting movement between the fixing portion 112a and the rotary plate 112b about the axis A1, thereby allowing users at different positions to view the information displayed on the electronic device. In this embodiment, the housing 114 is, for example, formed by three housings assembled together. However, the present invention is not limited to this particular construction. In another embodiment, the housing 114 may be assembled by another suitable number of housings.

The second pivoting element 120 of the present embodiment further includes a shielding plate 126. The shielding plate 126 is fixed to the housing 124 for shielding a portion of the electronic device 60. As such, the shielding plate 126 also has the function of preventing liquid from entering the interior of the electronic device 60, thus further enhancing the waterproofing effect of the overall structure.

In summary, the above embodiments of the present invention have at least one of the following advantages. The first waterproof structure fixed to the first pivoting element surrounds at least a portion of the opening to reduce the possibility of liquid entering the first internal space through the opening, and the second waterproof structure fixed to the second pivoting element shields the gap to reduce the possibility of liquid entering the second internal space through the gap. When the pivoting apparatus is splashed with outside liquid, the pivoting apparatus can be effectively waterproofed sequentially using the blockage of the second waterproof structure and the first waterproof structure to prevent internal components in the pivoting apparatus, the electronic device and the base from contacting the liquid to influence the normal operation thereof.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pivoting apparatus comprising:
    a first pivoting element fixed to a base and the first pivoting element having a first internal space and an opening, and the opening exposing the first internal space;
    a second pivoting element pivoted on the first pivoting element and the second pivoting element fixed to an electronic device, wherein a second internal space and a gap are formed between the first pivoting element and the second pivoting element, the gap exposes the second internal space, and the second internal space is in communication with the first internal space through the opening;
    a first waterproof structure fixed to the first pivoting element and the first waterproof structure surrounding at least a portion of the opening to block liquid from entering the first internal space through the opening; and
    a second waterproof structure including a rib and fixed to the second pivoting element and the second waterproof structure shielding the gap to block liquid from entering the second internal space through the gap; and
    the first pivoting element comprises a curved surface, the gap is formed between the curved surface and the second pivoting element, and the rib of the second waterproof structure is adapted to slide over the curved surface with the relative pivoting movement between the first pivoting element and the second pivoting element.

2. The pivoting apparatus according to claim 1, wherein the material of the first pivoting element and the first waterproof structure is plastic, and the first pivoting element and the first waterproof structure are integrally formed.

3. The pivoting apparatus according to claim 1, wherein the material of the second pivoting element and the second waterproof structure is plastic, and the second pivoting element and the second waterproof structure are integrally formed.

4. The pivoting apparatus according to claim 1, wherein the material of the second pivoting element is plastic, and the material of the second waterproof structure is rubber.

5. The pivoting apparatus according to claim 4, wherein the second pivoting element and the second waterproof structure are integrally formed by a double injection molding process.

6. The pivoting apparatus according to claim 1, wherein the first pivoting element comprises a curved surface, and the curved surface and the first waterproof structure are adapted to guide the liquid away from the opening.

7. The pivoting apparatus according to claim 1, wherein the first waterproof structure comprises a rib.

8. The pivoting apparatus according to claim 1, further comprising a conducting wire disposed in the pivoting apparatus, wherein the conducting wire is passed the opening and is connected between the electronic device and the base.

9. The pivoting apparatus according to claim 1, wherein the first pivoting element comprises:
   a main body pivoted by the second pivoting element and the main body fixed to the base; and
   a housing defining the first internal space and the opening, wherein the main body is disposed in the first internal space.

10. The pivoting apparatus according to claim 9, wherein the main body comprises:
    a fixing portion fixed to the base;
    a rotary plate pivoted on the fixing portion about a first axis; and
    a pivot portion fixed to the rotary plate and pivoted on the second pivoting element about a second axis wherein the second axis is perpendicular to the first axis.

11. The pivoting apparatus according to claim 1, wherein the second pivoting element comprises:
    a pivot portion pivoted on the first pivoting element and the pivot portion fixed to the electronic device; and
    a housing, wherein the second internal space and the gap are formed between the housing and the first pivoting element, and at least a part of the pivot portion is disposed in the second internal space.

12. The pivoting apparatus according to claim 11, wherein the second pivoting element further comprises a shielding plate fixed to the housing and shielding a portion of the electronic device.

13. The pivoting apparatus according to claim 1, wherein the electronic device is a display.

* * * * *